(12) United States Patent
Hwang

(10) Patent No.: US 8,878,197 B2
(45) Date of Patent: Nov. 4, 2014

(54) LIGHT EMITTING DEVICE, LIGHT EMITTING DEVICE PACKAGE AND LIGHTING SYSTEM

(75) Inventor: Sung Min Hwang, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/026,384

(22) Filed: Feb. 14, 2011

(65) Prior Publication Data

US 2011/0233515 A1    Sep. 29, 2011

(30) Foreign Application Priority Data

Mar. 23, 2010    (KR) .................. 10-2010-0025917

(51) Int. Cl.
*H01L 27/15* (2006.01)
*H01L 33/38* (2010.01)
*H01L 33/44* (2010.01)

(52) U.S. Cl.
CPC ............... *H01L 33/38* (2013.01); *H01L 27/15* (2013.01); *H01L 33/44* (2013.01)
USPC .......................................................... 257/79

(58) Field of Classification Search
USPC .......................................................... 257/79
See application file for complete search history.

(56) References Cited

U.S. PATENT DOCUMENTS

| | | | | |
|---|---|---|---|---|
| 5,977,565 A | * | 11/1999 | Ishikawa et al. | 257/81 |
| 6,893,889 B2 | | 5/2005 | Park et al. | |
| 7,411,221 B2 | * | 8/2008 | Cho et al. | 257/79 |
| 7,681,821 B2 | * | 3/2010 | Wilson et al. | 242/223 |
| 7,687,821 B2 | * | 3/2010 | Jeon et al. | 257/99 |
| 7,995,636 B2 | * | 8/2011 | Murakami et al. | 372/50.124 |
| 8,035,120 B2 | * | 10/2011 | Ito et al. | 257/98 |
| 8,587,015 B2 | * | 11/2013 | Aoyagi | 257/99 |
| 2005/0272107 A1 | | 12/2005 | Rabbitts et al. | |
| 2008/0105885 A1 | | 5/2008 | Watanabe et al. | |
| 2008/0230765 A1 | * | 9/2008 | Yoon et al. | 257/13 |
| 2009/0261373 A1 | * | 10/2009 | Shum et al. | 257/98 |

FOREIGN PATENT DOCUMENTS

| | | |
|---|---|---|
| CN | 1176497 A | 3/1998 |
| JP | 2004-342885 A | 12/2004 |
| KR | 10-0609968 B1 | 7/2006 |
| KR | 10-2008-0082101 A | 9/2008 |
| KR | 10-2008-0087251 A | 10/2008 |
| KR | 10-2009-0104514 A | 10/2009 |

* cited by examiner

*Primary Examiner* — David Vu
*Assistant Examiner* — Brandon Fox
(74) *Attorney, Agent, or Firm* — McKenna Long & Aldridge LLP

(57) ABSTRACT

Disclosed are a light emitting device, a light emitting device package, and a lighting system. The light emitting device includes a substrate; a light emitting structure including a first conductive semiconductor layer, an active layer and a second conductive semiconductor layer, which are formed on the substrate such that a part of the first conductive semiconductor layer is exposed; a dielectric layer formed from a top surface of the second conductive semiconductor layer to an exposed top surface of the first conductive semiconductor layer; a second electrode on the second conductive semiconductor layer; and a first electrode on the exposed top surface of the first conductive semiconductor layer while making contact with a part of the dielectric layer on the second conductive semiconductor layer.

13 Claims, 7 Drawing Sheets

$Q_0 = Q_1 + Q_2$

LIGHT EMITTING DEVICE, LIGHT EMITTING DEVICE PACKAGE AND LIGHTING SYSTEM

CROSS-REFERENCE TO RELATED APPLICATION

This application claims priority of Korean Patent Application No. 10-2010-0025917 filed Mar. 23, 2010, which is hereby incorporated by reference for all purposes as if fully set forth herein.

BACKGROUND OF THE INVENTION

The embodiment relates to a light emitting device, a light emitting device package and a lighting system.

A light emitting device (LED) includes a p-n junction diode having a characteristic of converting electric energy into light energy. The p-n junction diode can be formed by combining group III-V elements of the periodic table. The LED can represent various colors by adjusting the compositional ratio of compound semiconductors.

According to the related art, current flows in the reverse direction upon the electrostatic discharge (ESD) so that an active layer serving as a light emitting region may be damaged. In order to solve the above problem, a Zener diode is mounted in a package, but the Zener diode may absorb light.

In addition, according to the related art, current crowding may occur, so that the life span and the reliability of the LED may be degraded.

BRIEF SUMMARY

The embodiment provides a light emitting device package and a lighting system, capable of preventing damage caused by the electrostatic discharge (ESD) without loss of light quantity.

The embodiment provides a light emitting device package and a lighting system, capable of improving the light extraction efficiency as well as the current spreading efficiency.

A light emitting device according to the embodiment may include a substrate; a light emitting structure including a first conductive semiconductor layer, an active layer and a second conductive semiconductor layer, which are formed on the substrate such that a part of the first conductive semiconductor layer is exposed; a dielectric layer formed from a top surface of the second conductive semiconductor layer to an exposed top surface of the first conductive semiconductor layer; a second electrode on the second conductive semiconductor layer; and a first electrode on the exposed top surface of the first conductive semiconductor layer while making contact with a part of the dielectric layer on the second conductive semiconductor layer.

In addition, a light emitting device package according to the embodiment may include the light emitting device and a package body in which the light emitting device is installed.

A lighting system according to the embodiment may include a light emitting module including a substrate and the light emitting device package installed on the substrate.

DETAILED DESCRIPTION OF THE EMBODIMENTS

Hereinafter, a light emitting device, a light emitting device package, and a lighting system according to the embodiment will be described with reference to accompanying drawings.

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Embodiments

Figure 1:
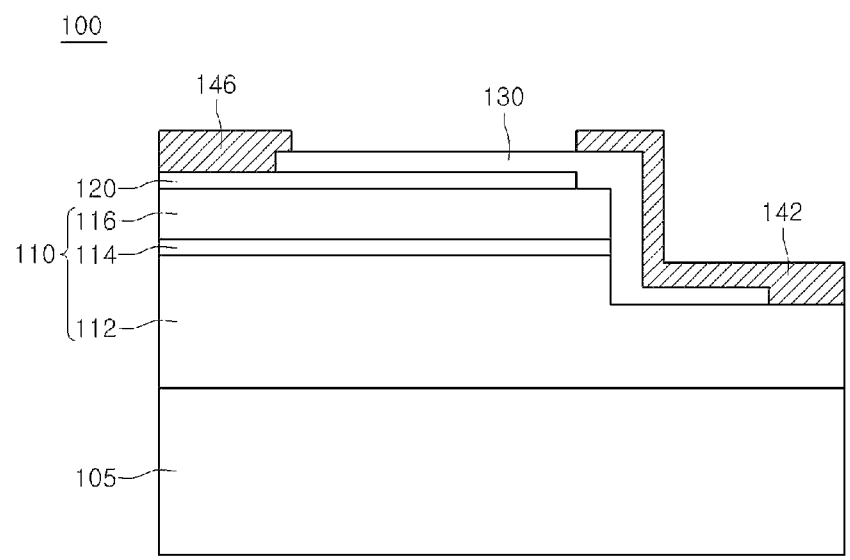
FIG. 1 is a sectional view showing a light emitting device according to the embodiment.

FIG. 1 is a sectional view showing a light emitting device according to the embodiment.

The light emitting device 100 according to the embodiment includes a substrate 105, a light emitting structure 110 having a first conductive semiconductor layer 112, an active layer 114 and a second conductive semiconductor layer 116, which are formed on the substrate 105 in such a manner that the first conductive semiconductor layer 112 can be partially exposed upward, a dielectric layer 130 formed on the exposed first conductive semiconductor layer 112 and the second conductive semiconductor layer 116, a second electrode 146 formed on the second conductive semiconductor layer 116, and a first electrode 142 formed on the exposed first conductive semiconductor layer 112 while making contact with a part of the dielectric layer 130 formed on the second conductive semiconductor layer 116.

According to the embodiment, the first electrode 142, the dielectric layer 130 and the second electrode 146 may serve as an MIM (Metal/Insulator/Metal) capacitor.

Figure 4:
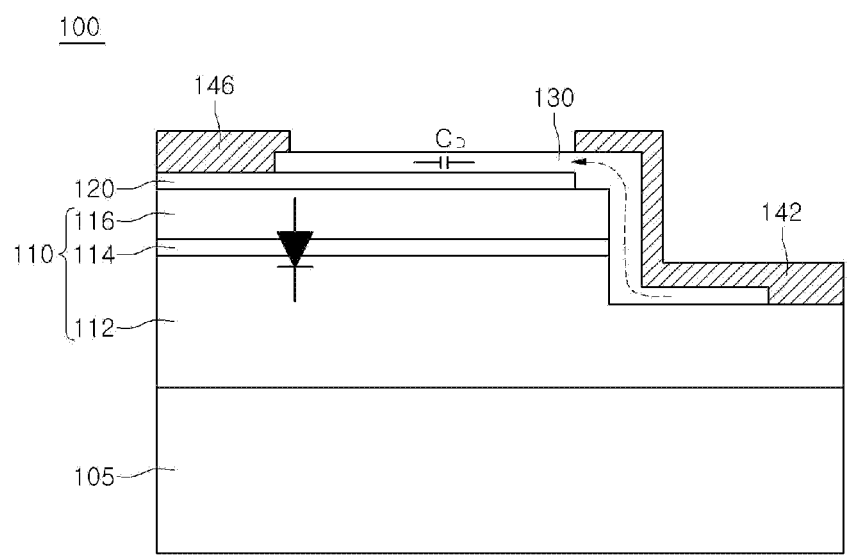
FIG. 4 is a sectional view showing the driving scheme of a light emitting device according to the embodiment.

FIG. 4 is a sectional view showing the driving scheme of the light emitting device 100 according to the embodiment.

According to the embodiment, the dielectric layer 130 is formed between the first and second electrodes 142 and 146 to electrically open the first and second electrodes 142 and 146, thereby protecting the LED from the ESD.

Therefore, as shown in FIG. 4, the current is applied to the active layer under the forward voltage so that the active layer emits the light, and if ESD impact is applied in the form of a pulse due to the ESD, high frequency energy (see, dotted lines) may pass through the dielectric layer so that the active layer can be protected.

According to the embodiment, the dielectric layer 130 is formed at a mesa edge region, thereby preventing current concentration in the mesa edge region while preventing the ESD.

As shown in FIG. 1, the first electrode 142 can be formed on the top surface of the dielectric layer 130 while making contact with the dielectric layer 130. In this case, a contact area between the first electrode 142 and the dielectric layer 130 can be enlarged so that the capacity can be increased and the dielectric layer 130 can firmly make contact with the light emitting structure by the first electrode 142.

In addition, according to the embodiment, the first electrode 142 formed on the first conductive semiconductor layer 112 may extend onto the top surface of the dielectric layer 130 formed on the second conductive semiconductor layer 116. In this case, a gap between the electrodes can be reduced, so that the electric field caused by the ESD can be easily induced to a capacitor of the dielectric layer 130 and the electric capacitance can be increased, thereby reducing the sudden discharge of electric charges into the LED chip.

As shown in FIG. 1, the dielectric layer 130 can make contact with the second electrode 146. In addition, the second electrode 146 that makes contact with the dielectric layer 130 may extend onto the top surface of the dielectric layer 130. In this case, the capacity can be increased and the dielectric layer 130 can be firmly maintained.

Meanwhile, different from FIG. 1, the dielectric layer 130 that makes contact with the second electrode 146 may extend onto the top surface of the second electrode 146 to increase the capacity.

As shown in FIG. 1, according to the embodiment, a transmittive electrode 120 can be formed on the light emitting structure 110 and the second electrode 146 can be formed on the transmittive electrode 120.

According to the embodiment, the dielectric layer 130 is formed on the light emitting region, so the dielectric layer 130 may be a transmittive dielectric layer, but the embodiment is not limited thereto.

Meanwhile, according to the embodiment, the dielectric layer 130 can make contact with the transmittive electrode 120 without making contact with the second electrode 146. In this case, the second conductive semiconductor layer 116, which is the light extraction region, may be less covered with the dielectric layer 130, so that the ESD protection efficiency and the light extraction efficiency can be improved.

According to the embodiment, in order to protect the LED from the ESD, the dielectric layer 130 is formed between the first and second electrodes 142 and 146. Thus, the current is applied to the active layer under the forward voltage so that the active layer emits the light, and if ESD impact is applied in the form of a pulse due to the ESD, high frequency energy may pass through the dielectric layer so that the active layer can be protected.

In addition, according to the embodiment, the first electrode 142 formed on the first conductive semiconductor layer 112 may extend onto the top surface of the dielectric layer 130 formed on the second conductive semiconductor layer 116. In this case, a gap between the electrodes can be reduced, so that the electric field caused by the ESD can be easily induced to a capacitor of the dielectric layer 130 and the electric capacitance can be increased, thereby reducing the sudden discharge of electric charges into the LED chip.

Figure 2:
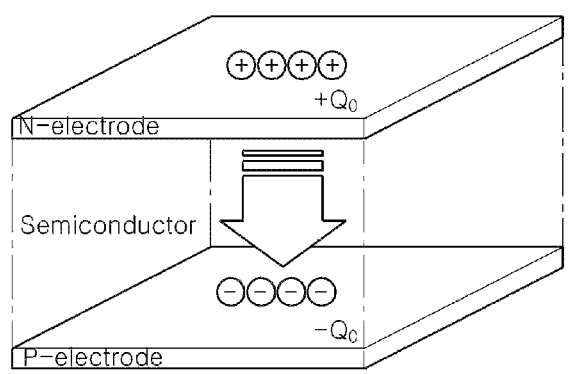
FIGS. 2 and 3 are schematic views showing the concept of forming an electric field upon the electrostatic discharge of a light emitting device according to the related art.
Figure 3:
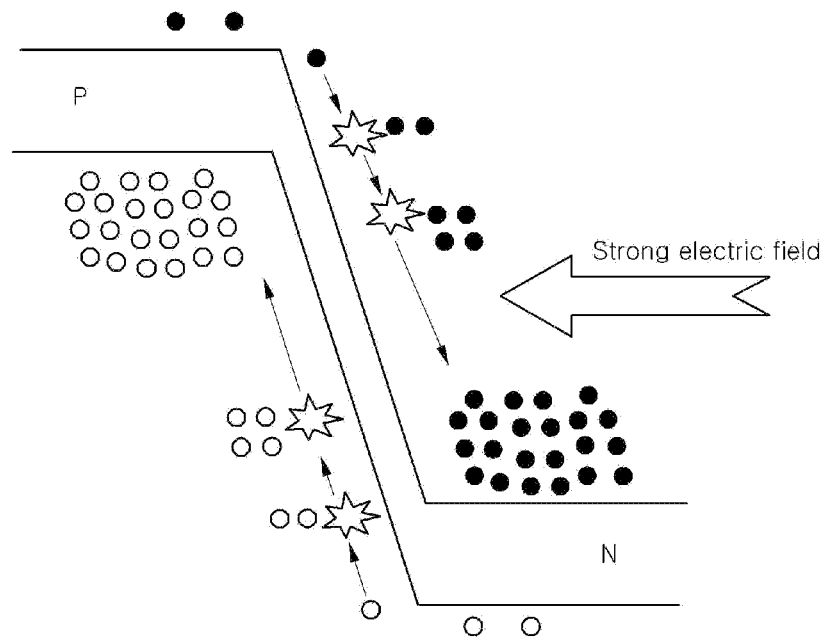
Figure 5:
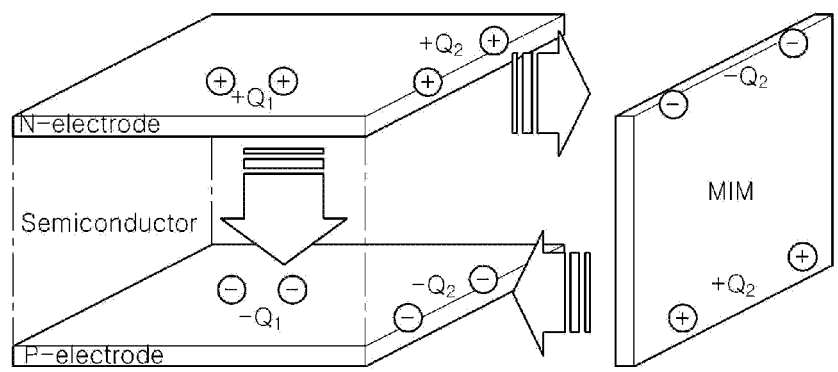
FIG. 5 is a schematic view showing the concept of forming an electric field upon the electrostatic discharge of a light emitting device according to the embodiment.

FIGS. 2 and 3 are schematic views showing the concept of forming the electric field upon the electrostatic discharge of the light emitting device according to the related art, and FIG. 5 is a schematic view showing the concept of forming the electric field upon the electrostatic discharge of the light emitting device according to the embodiment.

The LED breakage caused by the ESD may occur when the reverse voltage is applied to the semiconductor device. As shown in FIGS. 2 and 3, the strong electric field is induced into the LED active region due to charges which are electrified when the reverse voltage is applied.

In addition, as shown in FIG. 3, carriers (electrons and holes) are accelerated so that the carriers collide with atoms, thereby creating other carriers and the created carriers may create new carriers, which is called "avalanche breakdown". If the semiconductor device is subject to the excessive ESD due to the strong electric field induced by the electrified charges, the LED semiconductor may be broken due to the avalanche breakdown.

To solve the above problem, according to the embodiment, the MIM capacitor structure is provided as shown in FIG. 5. In this case, a part of the electric field applied to the active layer of the LED is induced to the MIM capacity so that the electric field is attenuated in the active region, thereby improving the resistance against the ESD.

In detail, according to the related art, all of the strong electric field $Q_0$ derived from the electrified charges can be induced to the LED active region, so that the LED breakage may occur due to the avalanche breakdown. In contrast, according to the embodiment, a part $Q_2$ of the strong electric field $Q_0$ derived from the electrified charges can be induced to the dielectric layer 130, so that intensity $Q_1$ of the electric field can be reduced in the LED active region.

Figure 6:
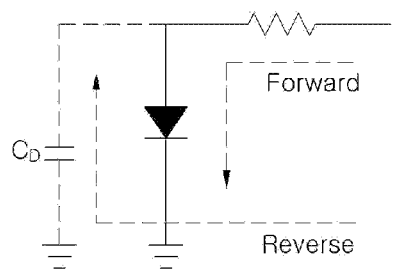
FIG. 6 is a schematic view showing a circuit structure of a light emitting device according to the embodiment.

FIG. 6 is a schematic view showing a circuit structure of the light emitting device according to the embodiment.

According to the embodiment, the first electrode 142, the dielectric layer 130 and the second electrode 146 may serve as a capacitor CD.

The light emitting device according to the embodiment may have the circuit structure as shown in FIG. 6. If the forward voltage is applied, the current flows through the LED so that the light is emitted. In addition, if the reverse voltage is applied due to the ESD, the current flows through the MIM capacitor CD.

At this time, when the reverse voltage is applied due to the ESD, the current flowing through the active layer may be lowered as the total capacitance $C_{Tot}$ is increased due to the ESD stress, thereby attenuating the impact.

This can be expressed as follows by using formulas.

$Q_{Dis} = C_{ESD} V_{ESD}$ ($Q_{Dis}$ is amount of charges upon ESD, and $C_{ESD}$ is capacitance upon ESD)

$C\text{Tot} = C\text{Diode} + CD$ (with MIM Capacitor)

$C\text{Tot} = C\text{Diode}$ (without MIM Capacitor)

$I = dQ/dt = \Delta Q/\tau = Q\text{Dis}/(RC\text{Tot}) \therefore C\text{Tot}\uparrow \to I\downarrow$ $I' = Q\text{Dis}/(RC'\text{Tot}) < I = Q\text{Dis}/(RC\text{Tot})$ That is, when the reverse voltage is applied due to the ESD, the current I' flowing through the active layer may be lowered as the total capacitance $C_{Tot}$ is increased due to the ESD stress, so that the impact can be attenuated.

Figure 7:
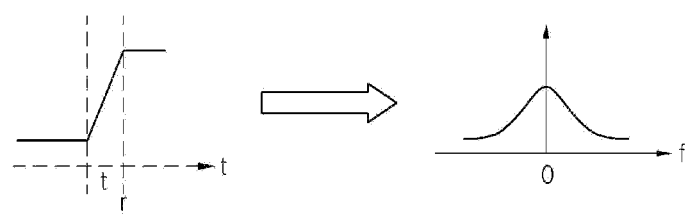
FIG. 7 is a schematic view showing a waveform upon the electrostatic discharge of a light emitting device according to the embodiment.

FIG. 7 is a schematic view showing a waveform upon the electrostatic discharge of the light emitting device according to the embodiment.

As shown in FIG. 7, the pulse waveform may have the high-frequency component through the Fourier transform. In addition, the intensity of the high-frequency component may be increased as the rising time (tr) is steep.

As can be seen from the following formula, the impedance caused by capacitance may become reduced as the frequency becomes high. Thus, when the reverse voltage is applied due to the ESD, the impedance of the MIM capacitor is reduced, so that the high-frequency current may flow through the MIM capacitor.

Impedance: $Z=Z_R+jZ_{Im}$ ($Z_R$ is real impedance, j is factor of imaginary part, and $Z_{Im}$ is impedance caused by capacitor), Capacitor: $Z_{Im,C}=1/(j\omega C)$, ($\omega=2\pi f$)

That is, when the reverse voltage is applied due to the ESD, the impedance of the MIM capacitor is reduced, so that the high-frequency current may flow through the MIM capacitor.

According to the light emitting device, the method of manufacturing the same and the light emitting device package of the embodiment, the LED can be protected from the ESD without the loss of light quantity.

According to the embodiment, the capacitor is provided in the LED chip to prevent damage caused by the ESD, so that the package can be manufactured through the simple process at the low cost and the light absorption can be diminished.

In addition, according to the embodiment, the first electrode 142 formed on the first conductive semiconductor layer 112 may extend onto the top surface of the dielectric layer 130 formed on the second conductive semiconductor layer 116. In this case, a gap between the electrodes can be reduced, so that the electric field caused by the ESD can be easily induced to a capacitor of the dielectric layer 130 and the electric capacitance can be increased, thereby reducing the sudden discharge of electric charges into the LED chip.

Further, according to the embodiment, the current flow can be efficiently adjusted, so that the light extraction efficiency can be improved.

In addition, according to the embodiment, the current spreading efficiency can be improved, so that the reliability of the light emitting device can be improved.

Hereinafter, the method for manufacturing the light emitting device according to the embodiment will be described with reference to FIGS. 8 to 10. According to the embodiment, the light emitting device may include group III-V elements, such as GaN, GaAs, GaAsP, or GaP, but the embodiment is not limited thereto. In addition, the embodiment is not limited to the process sequence described below, but various process sequences can be adopted in the embodiment.

Figure 8:
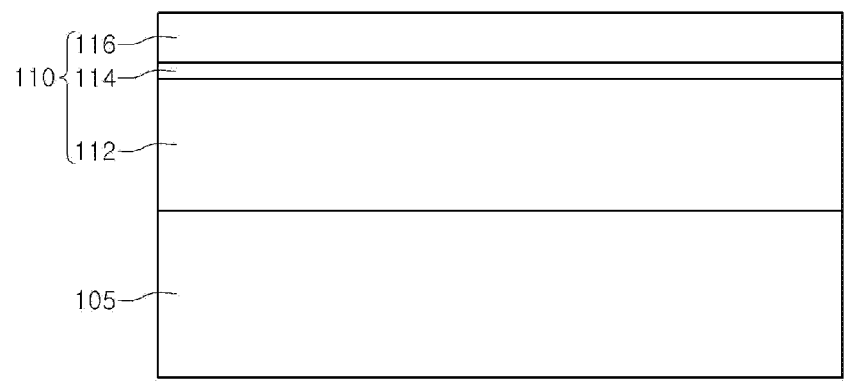
FIGS. 8 to 10 are sectional views showing a method for manufacturing a light emitting device according to the embodiment.

First, a substrate 105 as shown in FIG. 8 is prepared. The substrate 105 may include a conductive substrate or an insulating substrate. For instance, the substrate 105 may include at least one of $Al_2O_3$, SiC, Si, GaAs, GaN, ZnO, Si, GaP, InP, Ge, and $Ga_2O_3$. A concavo-convex structure can be formed on the substrate 105, but the embodiment is not limited thereto.

The substrate 105 can be subject to the wet cleaning process to remove impurities from the surface of the substrate 105.

Then, the light emitting structure 110 including the first conductive semiconductor layer 112, the active layer 114 and the second semiconductor layer 116 is formed on the substrate 105.

For instance, the light emitting structure 110 can be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), or HVPE (Hydride Vapor Phase Epitaxy), but the embodiment is not limited thereto.

A buffer layer (not shown) can be formed on the substrate 105. The buffer layer may attenuate lattice mismatch between the light emitting structure 110 and the substrate 105. The buffer layer may include the group III-V compound semiconductor. For instance, the buffer layer may include at least one of GaN, InN, AlN, InGaN, AlGaN, InAlGaN, and AlInN. An undoped semiconductor layer can be formed on the buffer layer, but the embodiment is not limited thereto.

The first conductive semiconductor layer 112 may include a group III-V compound semiconductor doped with a first conductive dopant. If the first conductive semiconductor layer 112 is an N type semiconductor layer, the first conductive dopant is an N type dopant, such as Si, Ge, Sn, Se, or Te, but the embodiment is not limited thereto.

The first conductive semiconductor layer 112 may include semiconductor material having the compositional formula of $In_xAl_yGa_{1-x-y}N$ ($0 \leq x \leq 1$, $0 \leq y \leq 1$, $0 \leq x+y \leq 1$).

In addition, the first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and InP.

The first conductive semiconductor layer 112 may include an N type GaN layer, which is formed through the CVD, MBE, sputtering or HYPE. In addition, the first conductive semiconductor layer 112 can be formed by injecting trimethyl gallium (TMGa) gas, ammonia ($NH_3$) gas, nitrogen ($N_2$) gas and silane ($SiH_4$) gas including n type impurities, such as silicon, into the chamber.

The active layer 114 emits the light having energy determined based on the intrinsic energy band of the active layer (light emitting layer) 114 through the recombination of electrons injected through the first conductive semiconductor layer 112 and holes injected through the second conductive semiconductor layer 116.

The active layer 114 may include at least one of a single quantum well structure, a multiple quantum well (MQW) structure, a quantum wire structure or a quantum dot structure. For instance, the active layer 114 can be formed with the MQW structure by injecting TMGa gas, $NH_3$ gas, $N_2$ gas, and trimethyl indium (TMIn) gas, but the embodiment is not limited thereto.

The active layer 114 may have a well/barrier layer including at least one of InGaN/GaN, InGaN/InGaN, AlGaN/GaN, InAlGaN/GaN, GaAs/AlGaAs(InGaAs) and GaP/AlGaP(InGaP), but the embodiment is not limited thereto. The well layer may include material having the band gap energy lower than that of the barrier layer.

A conductive clad layer (not shown) can be formed on and/or under the active layer 114. The conductive clad layer may include an AlGaN-based semiconductor having the band gap energy higher than that of the active layer 114.

The second conductive semiconductor layer 116 includes the group III-V compound semiconductor doped with the second conductive dopant. For instance, the second conductive semiconductor layer 116 may include the semiconductor material having the compositional formula of $In_xAl_yGa_{1-x-y}N$ ($0 \leq x \leq 1$, $0 \leq y \leq 1$, $0 \leq x+y \leq 1$). In detail, the second conductive semiconductor layer 116 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, the second conductive dopant includes the P type dopant such as Mg, Zn, Ca, Sr, or Ba. The second conductive semiconductor layer 116 can be prepared as a single layer or a multiple layer, but the embodiment is not limited thereto.

The second conductive semiconductor layer 116 may include a p type GaN layer, which can be formed by injecting TMGa gas, $NH_3$ gas, $N_2$ gas and $(EtCp_2Mg)\{Mg(C_2H_5C_5H_4)$ ₂} gas including p type impurities (for example, Mg) into the chamber, but the embodiment is not limited thereto.

According to the embodiment, the first conductive semiconductor layer 112 may include an N type semiconductor layer and the second conductive semiconductor layer 116 may include a P type semiconductor layer, but the embodiment is not limited thereto. In addition, a semiconductor layer, such as an N type semiconductor layer (not shown) having polarity opposite to that of the second conductive semiconductor layer 116, can be formed on the second conductive semiconductor layer 116. Thus, the light emitting structure 110 may include one of an N-P junction structure, a P-N junction structure, an N-P-N junction structure, and a P-N-P junction structure.

Figure 9:
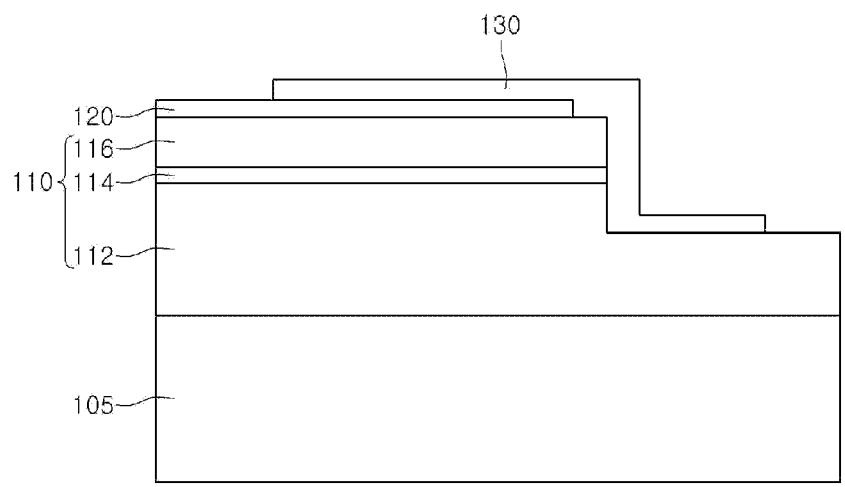

After that, as shown in FIG. 9, the light emitting structure 110 is mesa-etched such that a part of the first conductive semiconductor layer 112 can be exposed upward. For instance, the etching process is performed with respect to a region for the first electrode 142 by using a predetermined etching pattern (not shown) as an etching mask in such a manner that the second conductive semiconductor layer 116 and the active layer 114 can be etched, thereby exposing a part of the top surface of the first conductive semiconductor layer 112.

Then, according to the embodiment, the transmittive electrode 120 is formed on the light emitting structure. The transmittive electrode 120 can be formed by stacking a single metal (or a metal alloy) and metal oxide in a multiple structure. For instance, the ohmic layer may include at least one of ITO, IZO(In—ZnO), GZO(Ga—ZnO), AZO(Al—ZnO), AGZO(Al—Ga ZnO), IGZO(In—Ga ZnO), IrOx, RuOx, RuOx/ITO, Ni/IrOx/Au, Ni/IrOx/Au/ITO, Ni, Pt, Cr, Ti, and Ag, but the embodiment is not limited thereto.

Next, the dielectric layer 130 is formed on the exposed first conductive semiconductor layer 112 and the second conductive semiconductor layer 116. If the transmittive electrode 120 is provided, the dielectric layer 130 connects the exposed first conductive semiconductor layer 112 with the transmittive electrode 120.

Since the dielectric layer 130 can be formed on the light emitting region, the dielectric layer 130 may be a transmittive dielectric layer. The dielectric layer 130 may include $TiO_2$, $Al_2O_3$, or $SiO_2$, but the embodiment is not limited thereto.

According to the embodiment, the dielectric layer 130 is formed at a mesa edge region, thereby preventing current concentration in the mesa edge region while preventing the ESD.

Figure 10:
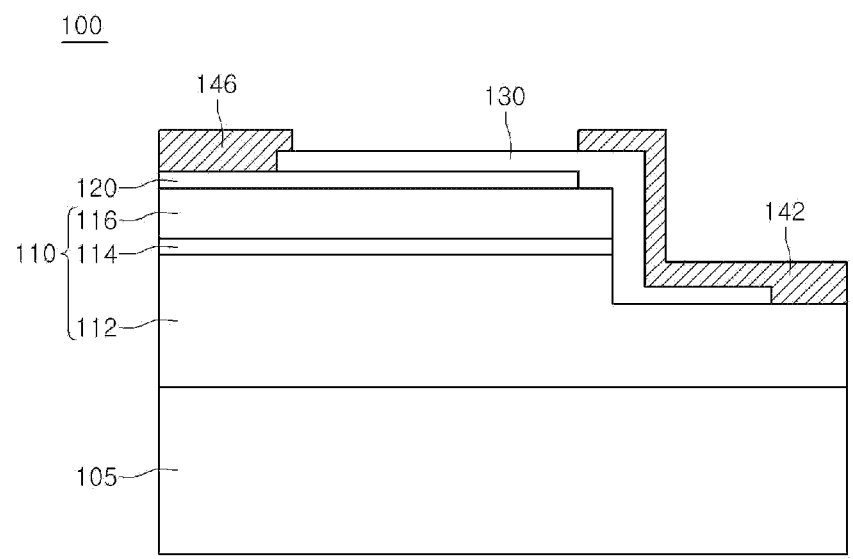

After that, as shown in FIG. 10, the first electrode 142 is formed on the exposed first conductive semiconductor layer 112 while making contact with the dielectric layer 130 and the second electrode 146 is formed on the second conductive semiconductor layer 116. If the transmittive electrode 120 is provided, the second electrode 146 may be formed on the transmittive electrode 120.

The first and second electrodes 142 and 146 may include at least one of Ti, Cr, Ni, Al, Pt, Au and W, but the embodiment is not limited thereto.

The first electrode 142 can be formed on the top surface of the dielectric layer 130 while making contact with the dielectric layer 130. In this case, a contact area between the first electrode 142 and the dielectric layer 130 can be enlarged so that the capacity can be increased and the dielectric layer 130 can firmly make contact with the light emitting structure by the first electrode 142.

In addition, according to the embodiment, the first electrode 142 formed on the first conductive semiconductor layer 112 may extend onto the top surface of the dielectric layer 130 formed on the second conductive semiconductor layer 116. In this case, a gap between the electrodes can be reduced, so that the electric field caused by the ESD can be easily induced to a capacitor of the dielectric layer 130 and the electric capacitance can be increased, thereby reducing the sudden discharge of electric charges into the LED chip.

In addition, the dielectric layer 130 can make contact with the second electrode 146. Further, the second electrode 146 that makes contact with the dielectric layer 130 may extend onto the top surface of the dielectric layer 130. In this case, the capacity can be increased and the dielectric layer 130 can be firmly maintained.

Meanwhile, different from FIG. 10, the dielectric layer 130 that makes contact with the second electrode 146 may extend onto the top surface of the second electrode 146 to increase the capacity. In this case, the dielectric layer 130 is formed after the second electrode 146 has been formed, so that the dielectric layer 130 is formed on the second electrode 146.

In addition, different from FIG. 10, the dielectric layer 130 can make contact with the transmittive electrode 120 without making contact with the second electrode 146. In this case, the second conductive semiconductor layer 116, which is the light extraction region, may be less covered with the dielectric layer 130, so that the ESD protection efficiency and the light extraction efficiency can be improved.

According to the light emitting device, the method of manufacturing the same and the light emitting device package of the embodiment, the LED can be protected from the ESD without the loss of light quantity.

According to the embodiment, the capacitor is provided in the LED chip to prevent damage caused by the ESD, so that the package can be manufactured through the simple process at the low cost and the light absorption can be diminished.

In addition, according to the embodiment, the first electrode formed on the first conductive semiconductor layer may extend onto the top surface of the dielectric layer formed on the second conductive semiconductor layer. In this case, a gap between the electrodes can be reduced, so that the electric field caused by the ESD can be easily induced to a capacitor of the dielectric layer and the electric capacitance can be increased, thereby reducing the sudden discharge of electric charges into the LED chip.

In addition, according to the embodiment, the extraction efficiency can be improved by effectively adjusting the current flow. Further, the current spreading efficiency can be improved, so that the reliability of the light emitting device can be improved.

Figure 11:
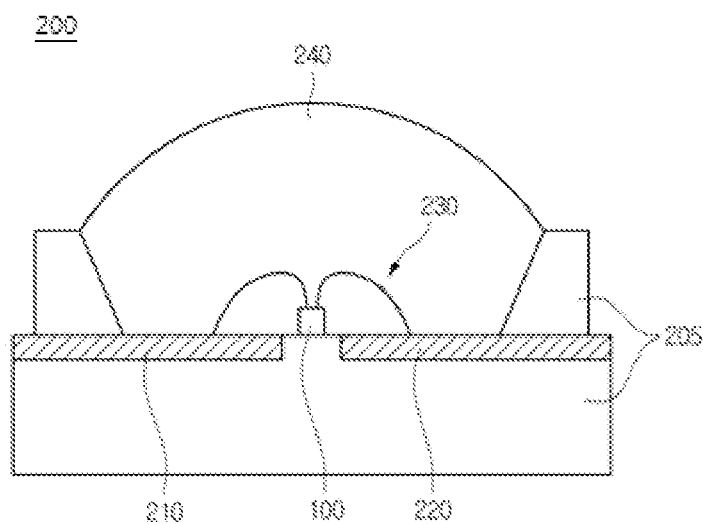
FIG. 11 is a sectional view showing a light emitting device package according to the embodiment.

FIG. 11 is a sectional view showing a light emitting device package 200 according to the embodiment.

Referring to FIG. 11, the light emitting device package 200 includes a body 205, fourth and fifth electrode layers 210 and 220 formed on the body 205, the light emitting device 100 provided on the body 205 and electrically connected to the fourth and fifth electrode layers 210 and 220 and a molding member 240 that surrounds the light emitting device 100.

The body 205 may include silicon, synthetic resin or metallic material. An inclined surface may be formed around the light emitting device 100.

The fourth and fifth electrode layers 210 and 220 are electrically isolated from each other to supply power to the light emitting device 100. In addition, the fourth and fifth electrode layers 210 and 220 reflect the light emitted from the light emitting device 100 to improve the light efficiency and dissipate heat generated from the light emitting device 100 to the outside.

The lateral type light emitting device shown in FIG. 1 can be employed as the light emitting device 100, but the embodiment is not limited thereto. For instance, the vertical type light emitting device can be used as the light emitting device 100.

The light emitting device 100 can be electrically connected to the fourth electrode layer 210 and/or the fifth electrode layer 220 through a wire 230. According to the embodiment, the lateral type light emitting device 100 is illustrated so that two wires 230 are employed. In the case of the flip chip type light emitting device, the wire 230 may be omitted.

The molding member 240 surrounds the light emitting device 100 to protect the light emitting device 100. In addition, the molding member 240 may include luminescence materials to change the wavelength of the light emitted from the light emitting device 100.

The light emitting device package can be equipped with at least one light emitting device according to the embodiment, but the embodiment is not limited thereto.

A plurality of light emitting device packages according to the embodiment may be arrayed on a substrate, and an optical member including a light guide plate, a prism sheet, a diffusion sheet or a fluorescent sheet may be provided on the optical path of the light emitted from the light emitting device package. The light emitting device package, the substrate, and the optical member may serve as a backlight unit or a lighting unit. For instance, the lighting system may include a backlight unit, a lighting unit, an indicator, a lamp or a streetlamp.

Figure 12:
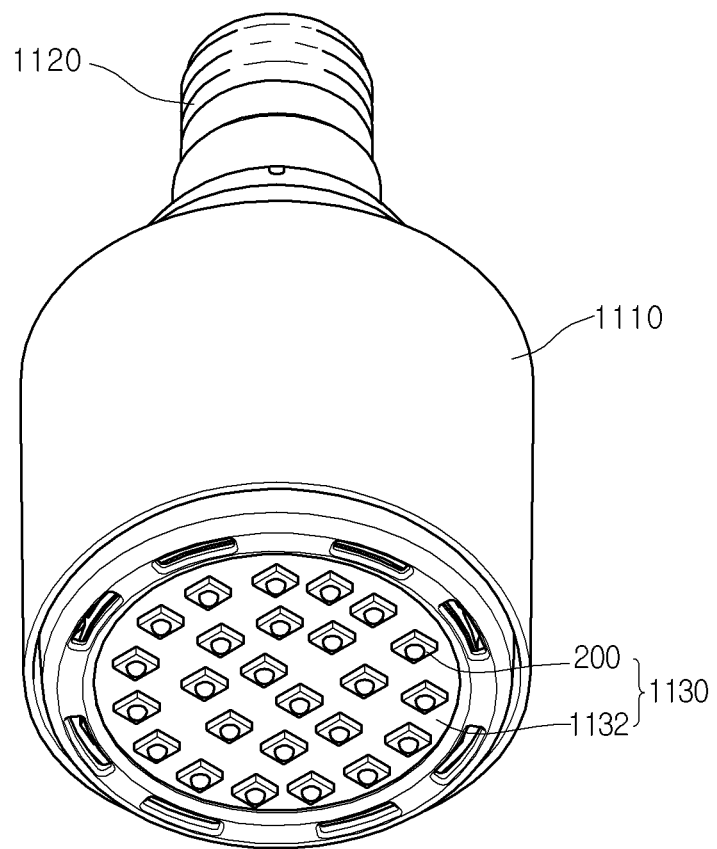
FIG. 12 is a perspective view showing a lighting unit according to the embodiment.

FIG. 12 is a perspective view showing a lighting unit 1100 according to the embodiment. The lighting unit 1100 shown in FIG. 12 is an example of a lighting system and the embodiment is not limited thereto.

Referring to FIG. 12, the lighting unit 1100 includes a case body 1110, a light emitting module 1130 installed in the case body 1110, and a connection terminal 1120 installed in the case body 1110 to receive power from an external power source.

Preferably, the case body 1110 includes a material having superior heat dissipation property. For instance, the case body 1110 includes a metallic material or a resin material.

The light emitting module 1130 may include a substrate 1132 and at least one light emitting device package 200 installed on the substrate 1132.

The substrate 1132 includes an insulating member printed with a circuit pattern. For instance, the substrate 1132 includes a PCB (printed circuit board), an MC (metal core) PCB, a flexible PCB, or a ceramic PCB.

In addition, the substrate 1132 may include a material that effectively reflects the light. The surface of the substrate 1132 can be coated with a color, such as a white color or a silver color, to effectively reflect the light.

At least one light emitting device package 200 can be installed on the substrate 1132. Each light emitting device package 200 may include at least light emitting device 100. The light emitting device 100 may include a colored LED that emits the light having the color of red, green, blue or white and a UV (ultraviolet) LED that emits UV light.

The light emitting module 1130 may have various combinations of the light emitting device packages 200 to obtain various colors and brightness. For instance, the white LED, the red LED and the green LED can be combined to achieve the high color rendering index (CRI).

The connection terminal 1120 is electrically connected to the light emitting module 1130 to supply power to the light emitting module 1130. The connection terminal 1120 has a shape of a socket screw-coupled with the external power source, but the embodiment is not limited thereto. For instance, the connection terminal 1120 can be prepared in the form of a pin inserted into the external power source or connected to the external power source through a wire.

Figure 13:
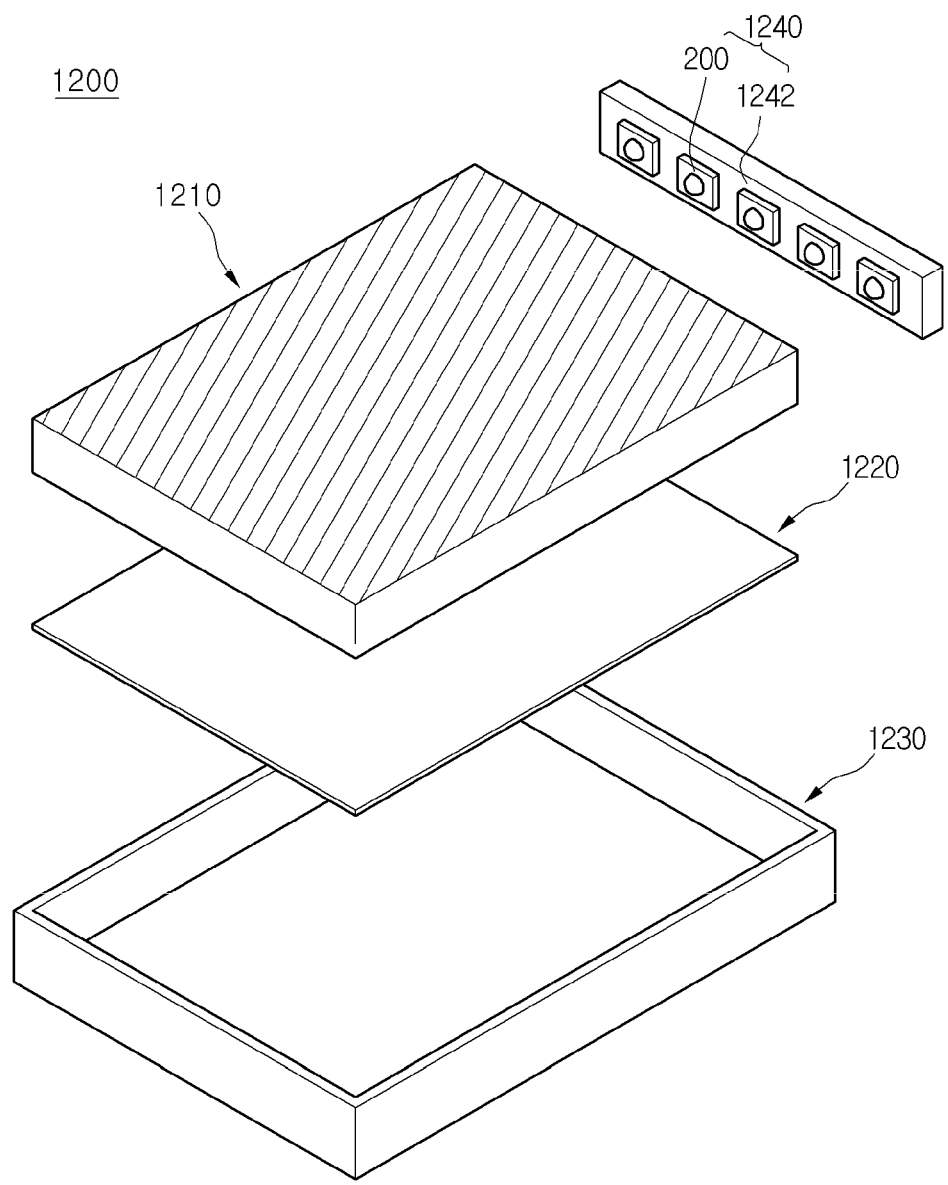
FIG. 13 is an exploded perspective view showing a backlight unit according to the embodiment.

FIG. 13 is an exploded perspective view showing a backlight unit 1200 according to the embodiment. The backlight unit 1200 shown in FIG. 13 is an example of a lighting system and the embodiment is not limited thereto.

The backlight unit 1200 according to the embodiment includes a light guide plate 1210, a light emitting module 1240 for providing the light to the light guide plate 1210, a reflective member 1220 positioned below the light guide plate, and a bottom cover 1230 for receiving the light guide plate 1210, light emitting module 1240, and the reflective member 1220 therein, but the embodiment is not limited thereto.

The light guide plate 1210 diffuses the light to provide surface light. The light guide 1210 includes transparent material. For instance, the light guide plate 1210 can be manufactured by using acryl-based resin, such as PMMA (polymethyl methacrylate), PET (polyethylene terephthalate), PC (polycarbonate), COC or PEN (polyethylene naphthalate) resin.

The light emitting module 1240 supplies the light to at least one lateral side of the light guide plate 1210 and serves as the light source of the display device including the backlight unit.

The light emitting module 1240 can be positioned adjacent to the light guide plate 1210, but the embodiment is not limited thereto. In detail, the light emitting module 1240 includes a substrate 1242 and a plurality of light emitting device packages 200 installed on the substrate 1242 and the substrate 1242 can be adjacent to the light guide plate 1210, but the embodiment is not limited thereto.

The substrate 1242 may include a printed circuit board (PCB) having a circuit pattern (not shown). In addition, the substrate 1242 may also include a metal core PCB (MCPCB) or a flexible PCB (FPCB), but the embodiment is not limited thereto.

In addition, the light emitting device packages 200 are arranged such that light exit surfaces of the light emitting device packages 200 are spaced apart from the light guide plate 1210 by a predetermined distance.

The reflective member 1220 is disposed below the light guide plate 1210. The reflective member 1220 reflects the light, which is travelled downward through the bottom surface of the light guide plate 1210, toward the light guide plate 1210, thereby improving the brightness of the backlight unit. For instance, the reflective member 1220 may include PET, PC or PVC resin, but the embodiment is not limited thereto.

The bottom cover 1230 may receive the light guide plate 1210, the light emitting module 1240, and the reflective member 1220 therein. To this end, the bottom cover 1230 has a box shape with an open top surface, but the embodiment is not limited thereto.

The bottom cover 1230 can be manufactured through a press process or an extrusion process by using metallic material or resin material.

According to the light emitting device, the method of manufacturing the same and the light emitting device package of the embodiment, the LED can be protected from the ESD without the loss of light quantity.

According to the embodiment, the capacitor is provided in the LED chip to prevent damage caused by the ESD, so that the package can be manufactured through the simple process at the low cost and the light absorption can be diminished.

According to the embodiment, the capacitor is provided in the LED chip to prevent damage caused by the ESD, so that the package can be manufactured through the simple process at the low cost and the light absorption can be diminished.

In addition, according to the embodiment, the first electrode formed on the first conductive semiconductor layer may extend onto the top surface of the dielectric layer formed on the second conductive semiconductor layer. In this case, a gap between the electrodes can be reduced, so that the electric field caused by the ESD can be easily induced to a capacitor of the dielectric layer and the electric capacitance can be increased, thereby reducing the sudden discharge of electric charges into the LED chip.

Further, according to the embodiment, the current flow can be efficiently adjusted, so that the light extraction efficiency can be improved. In addition, according to the embodiment, the current spreading efficiency can be improved, so that the reliability of the light emitting device can be improved.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
    a substrate;
    a light emitting structure including a first conductive semiconductor layer, an active layer and a second conductive semiconductor layer, which are formed on the substrate such that a part of the first conductive semiconductor layer is exposed;
    a transmittive electrode on the light emitting structure;
    a dielectric layer continuously formed from a top surface of the transmittive electrode to an exposed top surface of the first conductive semiconductor layer;
    a second electrode on the second conductive semiconductor layer directly contacting a portion of the dielectric layer; and
    a first electrode covering to an outer edge portion an exposed top surface of the first conductive semiconductor layer that is not covered by the dielectric layer and extending onto a top surface of the dielectric layer on the second conductive semiconductor layer.

2. The light emitting device of claim 1, wherein the dielectric layer is formed on a mesa edge region.

3. The light emitting device of claim 1, wherein the dielectric layer includes a transmittive dielectric layer.

4. The light emitting device of claim 1, wherein the first electrode, the dielectric layer and the second electrode constitute an MIM capacitor.

5. The light emitting device of claim 1, wherein the second electrode is formed on the transmittive electrode.

6. A light emitting device package comprising;
    a light emitting device claimed in claim 1; and
    a package body in which the light emitting device is installed.

7. A lighting system comprising;
    a light emitting module including a substrate and a light emitting device package claimed in claim 6 and installed on the substrate.

8. The light emitting device of claim 1, wherein the dielectric layer is disposed between the first electrode and the second electrode and comprises only a transmittive dielectric layer.

9. The light emitting device of claim 1, wherein a side surface of the first electrode and the side surface of the second electrode are vertically aligned with a side surface of the light emitting structure.

10. The light emitting device of claim 1, wherein a first portion of the dielectric layer overlaps with the transmittive electrode and is larger than a second portion of the dielectric layer that overlaps with the second electrode.

11. The light emitting device of claim 1, wherein the second electrode is contacted with at least a top most surface of the dielectric layer.

12. The light emitting device of claim 11, wherein a region where the first electrode is contacted with the top surface of the dielectric layer is larger than a region wherein the second electrode is contacted with a top most surface of the dielectric layer.

13. The light emitting device of claim 1, wherein a lateral width of the transmittive electrode is smaller than a lateral width of the second conductive semiconductor layer, and
    wherein the dielectric layer is contacted with both a top most surface of the second conductive semiconductor layer and the exposed top surface of the first conductive semiconductor layer.

* * * * *